(12) United States Patent
Rost

(10) Patent No.: US 8,604,524 B2
(45) Date of Patent: Dec. 10, 2013

(54) TRANSISTOR DESIGN AND LAYOUT FOR PERFORMANCE IMPROVEMENT WITH STRAIN

(75) Inventor: Timothy A Rost, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 418 days.

(21) Appl. No.: 12/337,349

(22) Filed: Dec. 17, 2008

(65) Prior Publication Data

US 2009/0095987 A1 Apr. 16, 2009

Related U.S. Application Data

(62) Division of application No. 10/785,648, filed on Feb. 24, 2004, now Pat. No. 7,482,214.

(60) Provisional application No. 60/533,774, filed on Dec. 30, 2003.

(51) Int. Cl.
*H01L 29/04* (2006.01)

(52) U.S. Cl.
USPC .............. 257/255; 257/E29.004; 257/E21.424

(58) Field of Classification Search
USPC ............................ 257/255, E29.004, E21.424
See application file for complete search history.

(56) References Cited

U.S. PATENT DOCUMENTS

| | | |
|---|---|---|
| 2002/0063292 A1 | 5/2002 | Armstrong et al. |
| 2004/0173812 A1 | 9/2004 | Currie et al. |
| 2004/0256639 A1* | 12/2004 | Ouyang et al. ............... 257/202 |
| 2005/0009263 A1 | 1/2005 | Yeo et al. |
| 2005/0035369 A1 | 2/2005 | Lin et al. |
| 2005/0164477 A1 | 7/2005 | Chidambarrao et al. |

* cited by examiner

*Primary Examiner* — Long Pham
(74) *Attorney, Agent, or Firm* — Jacqueline J. Garner; Wade J. Brady, III; Frederick J. Telecky, Jr.

(57) ABSTRACT

The present invention facilitates semiconductor device fabrication and performance by providing a semiconductor device that can improve channel mobility for both N type and P type transistor devices. The semiconductor device of the present invention is fabricated on a semiconductor substrate 802 that has a first and second crystallographic orientation axes (e.g., <110>, <100>) 804 and 806. Source to drain channel regions for P type devices are formed 904 and aligned along the first crystallographic orientation axis. Source to drain channel regions for N type devices are formed 906 rotated from the channel regions of the P type devices by an offset angle so that the source to drain channel regions for the N type devices are aligned with the second crystallographic orientation axis. Subsequently, a uniaxial or biaxial tensile stress 908 is applied to the source to drain channel regions of the N type devices and a uniaxial or biaxial compressive stress 910 is applied to the source to drain channel regions of the P type devices.

11 Claims, 8 Drawing Sheets

TRANSISTOR DESIGN AND LAYOUT FOR PERFORMANCE IMPROVEMENT WITH STRAIN

This is a divisional application of Ser. No. 10/785,648 filed Feb. 24, 2004 which is a non-provisional application of provisional application Ser. No. 60/533,774 filed Dec. 30, 2003.

RELATED APPLICATIONS

This application claims the priority of U.S. Provisional Application Ser. No. 60/533,774, filed Dec. 30, 2003, entitled TRANSISTOR DESIGN AND LAYOUT FOR PERFORMANCE IMPROVEMENT WITH STRAIN.

FIELD OF THE INVENTION

The present invention relates generally to the field of semiconductor devices, and more particularly, to systems and methods that facilitate scaling and performance by improving channel mobility for N type and P type transistor devices.

BACKGROUND OF THE INVENTION

There exists a continuing need to improve semiconductor device performance and further scale semiconductor devices. These needs can be met by improvements in two broad categories; process and structure. Process improvements are those that allow the fabrication of devices and circuits with smaller dimensions in ever higher density, quantity and reliability. The structure improvements include new device designs that allow greater circuit performance, control and reliability.

As devices have continued to shrink and improve in performance, a number of characteristics have become important to further device scaling and performance improvement. One such characteristic is channel mobility, which is a factor in scalability and device performance. Channel mobility is electron and hole mobility through a channel region (source to drain) of a transistor. As devices continue to shrink in size, the channel region for transistors continues to also shrink in size. Such shrinkage can negatively impact channel mobility and lead to problems such as short channel effects.

As a result, improvements in channel mobility can lead to improvements in scaling and performance. One technique that may improve scaling limits and device performance is to introduce strain into the channel region, which can improve electron and hole mobility. Different types of strain, including biaxial tensile strain, uniaxial tensile strain, biaxial compressive strain, and unitaxial compressive strain, have been introduced to channel regions of various types of transistors in order to determine their affect on electron and/or hole mobility. For some devices, types of strain improve mobility whereas other degrade mobility.

A problem with applying strain to a semiconductor device is that the strain can improve performance for one type of device (e.g., PMOS) while at the same time degrading performance of another type of device (e.g., NMOS). As a result, tradeoffs are often made in conventional devices for performance of one type versus another.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention includes structure and process improvements that facilitate performance and fabrication of semiconductor devices. The present invention provides for a semiconductor device and layout that can improve electron mobility for N type (NMOS devices) and hole mobility for P type (PMOS devices) by aligning the devices channel regions, respectively, along suitable crystallographic orientation axes of a semiconductor substrate. Furthermore, the present invention further facilitates the electron and hole mobility for the N type and P type devices, respectively, by selectively applying strain to the channel regions.

The semiconductor device of the present invention is fabricated on a semiconductor substrate that has a first and second crystallographic orientation axes (e.g., <110>, <100>). Source to drain channel regions for P type devices are aligned along the first crystallographic orientation axis. Source to drain channel regions for N type devices are rotated from the channel regions of the P type devices by an offset angle so that the source to drain channel regions for the N type devices are aligned with the second crystallographic orientation axis. Subsequently, a uniaxial or biaxial tensile stress is applied to the source to drain channel regions of the N type devices and a uniaxial or biaxial compressive stress is applied to the source to drain channel regions of the P type devices. In the above manner, carrier mobility is enhanced for both NMOS and PMOS devices, concurrently, on the same die.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

There is an ongoing need to scale components and features of semiconductor devices. Scaling can reduce costs of fabrication by fitting more components on a single device and can improve performance by shortening paths of operation. As the dimensions on components of a semiconductor device (e.g., chip) continue to be reduced, a key component is a transistor, and a key dimension of the transistor is the gate length. For example, an increase in operation from a 400 Mhz semiconductor device to a 1 Ghz semiconductor device can be at least in part achieved by scaling the dimensions of the transistor.

However, scaling becomes more difficult as devices and designs approach smaller dimensions, or even approach the physical dimensions of the atoms and molecules that comprise the semiconductor devices (i.e., building blocks). As the scaling and technology approaches some of the physical dimensions that are becoming problematic, such as atom and molecular dimensions, it becomes more difficult to scale.

One method of improving the performance of a transistor is to improve the mobility of carriers in the channel. One mechanism to improve this mobility, which is employed by the present invention, is to introduce strain. Strain impacts the mobility of carriers in the channel through the piezoresistive effect. The piezoresistive effect implies as the piezoresistance is decreased, the mobility increases, and therefore transistor performance increases.

Figure 1:
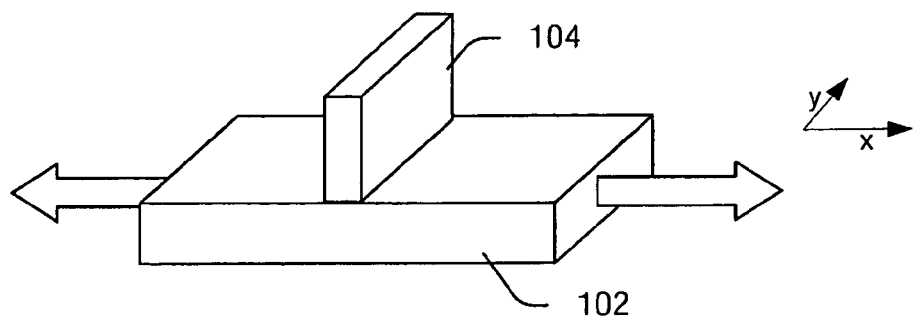
FIG. 1 is a diagram illustrating effects of uniaxial tensile stress on a channel region.
Figure 2:
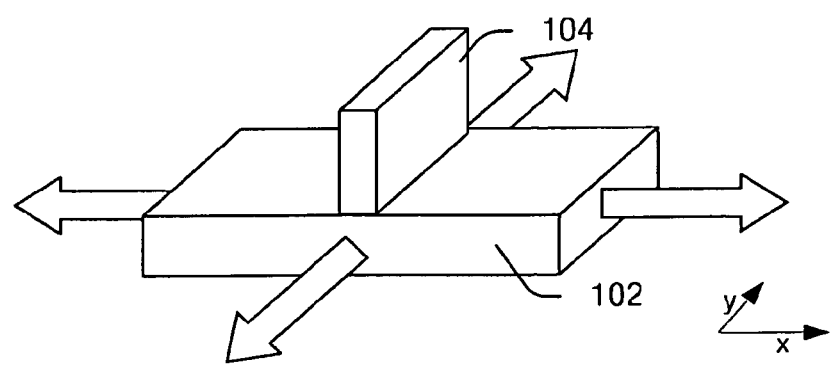
FIG. 2 is a diagram illustrating effects of biaxial tensile stress on a channel region.

Channel mobility can be defined in terms of electron mobility and hole mobility. Generally, P type transistors utilize holes or hole mobility across their channel regions from source to drain as the primary carrier and N type transistors utilize electrons or electron mobility across their channel regions from source to drain as the primary carrier. Different types of strain, such as uniaxial tensile, biaxial tensile, uniaxial compressive, and biaxial compressive, interact with the crystalline lattice to alter mobility in different ways. FIGS. 1-4, described below illustrate the effects of examples of different types of strain. Beginning with FIG. 1, a diagram illustrating uniaxial tensile stress on a channel region is provided. The diagram shows a channel region 102 and a gate structure 104 formed over the channel region 102. The channel region 102 extends from a source region (not shown) to an active region (not shown) and is formed in a silicon substrate under the gate 104. The uniaxial stress stretches the channel region 102 longitudinally in an x dimension as indicated in FIG. 1. As a result, the crystal structure of the channel region 102 is altered resulting in electron mobility being improved but, degrading hole mobility. Consequently, such a strain may be beneficial for an NMOS device but degrade performance of a PMOS device. FIG. 2 is a diagram illustrating biaxial tensile stress on a channel region 102. The channel region 102 extends from a source region (not shown) to an active region (not shown) and is formed in silicon substrate with a crystal structure. The biaxial stress stretches the channel region 102 as indicated in FIG. 2 in an x (longitudinal) and y (transverse) direction, altering the crystal structure of the channel region 102 and, in this case, improving both electron mobility and hole mobility.

Figure 3:
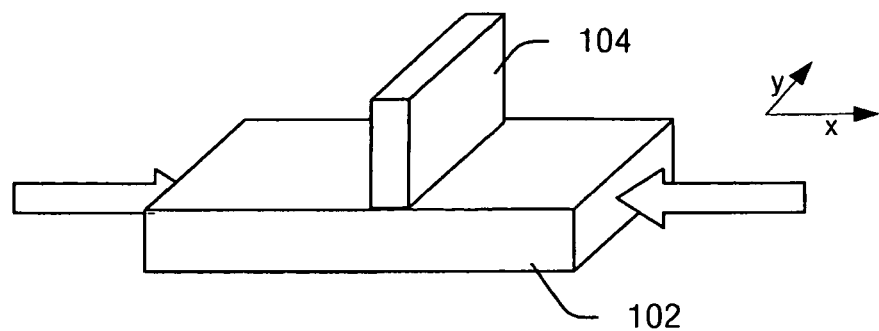
FIG. 3 is a diagram illustrating effects of uniaxial compressive stress on a channel region.
Figure 4:
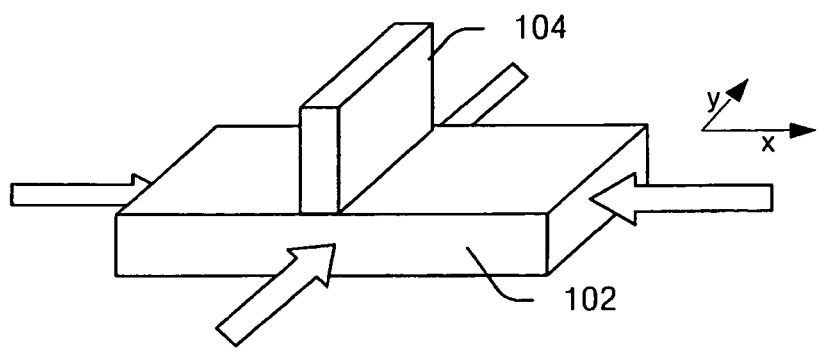
FIG. 4 is a diagram illustrating effects of biaxial compressive stress on a channel region.

FIG. 3 is another diagram illustrating uniaxial compressive stress on a channel region 102. The channel region 102 extends from a source region (not shown) to an active region (not shown) and is formed in a silicon substrate. The uniaxial compressive stress compresses the channel region 102 longitudinally as indicated in FIG. 3 in an x direction, which alters the crystal structure of the silicon crystal in the channel region 102. As a result, hole mobility is improved, but electron mobility is degraded. Accordingly, PMOS performance may improve while NMOS performance may degrade. FIG. 4 is a diagram illustrating biaxial compressive stress on a channel region 102. The channel region 102 extends from a source region (not shown) to an active region (not shown) and is formed in a silicon substrate. The biaxial compressive stress compresses the channel region 102 as indicated in FIG. 4 in an x (longitudinal) and y (transverse) direction, which alters the crystal structure of the channel region 102 and in some cases may improve hole mobility, but tends to degrade electron mobility.

It is appreciated that FIGS. 1-4, above, are provided to facilitate understanding and appreciating the present invention. FIGS. 1-4 are discussed with respect to a silicon based substrate, however, the present invention includes other suitable semiconductor materials for device formation. However, the effects of stress on the channel regions may vary for other types of semiconductor materials.

Figure 5:
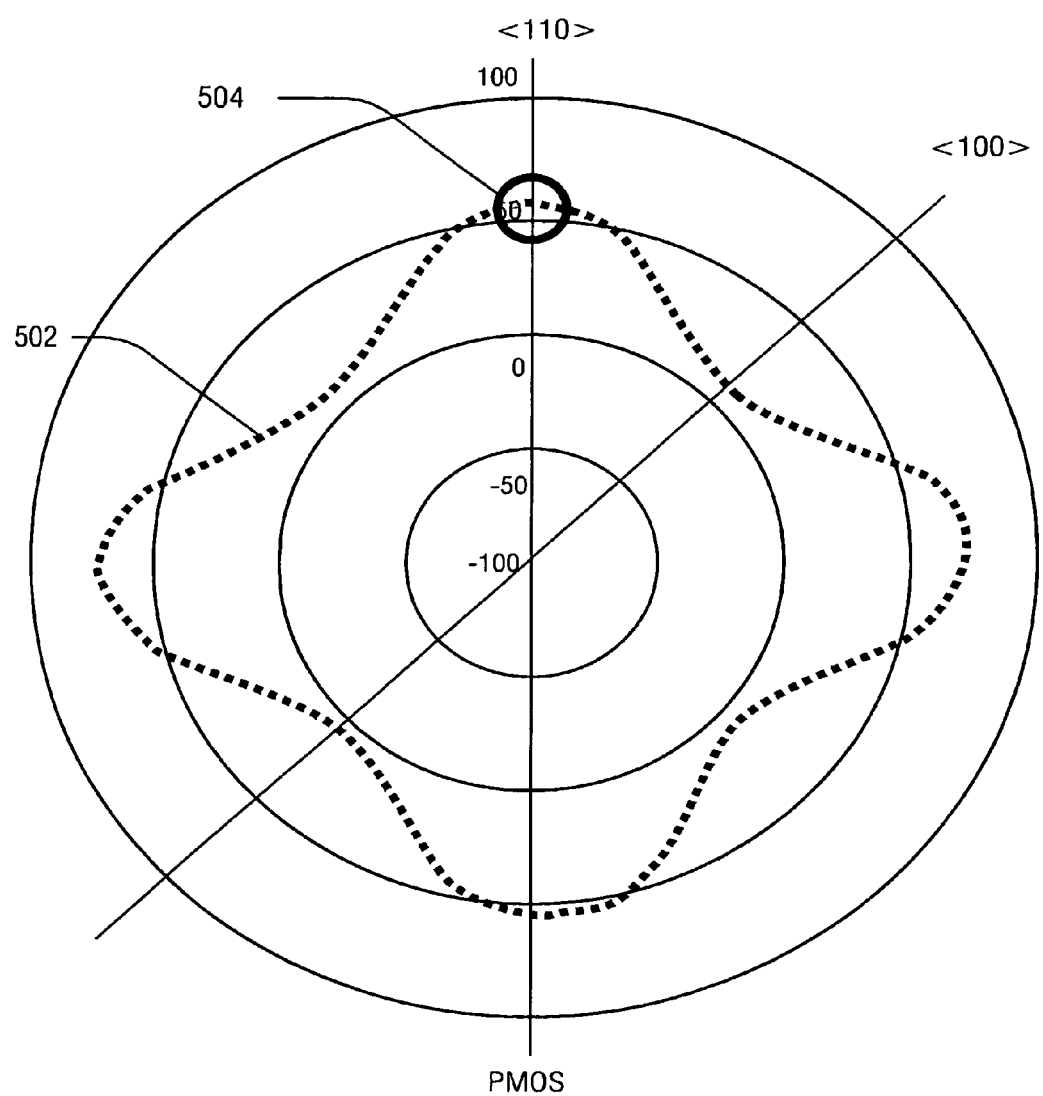
FIG. 5 is a graph illustrating exemplary piezoresistance values for a PMOS transistor device oriented along various crystallographic orientation axes.

As stated above, the piezoresistive effect modifies channel mobility. Generally, as piezoresistance decreases, channel electron mobility increases, and therefore transistor performance increases. Turning now to FIG. 5, a graph illustrating exemplary piezoresistance for a PMOS transistor device oriented along various crystallographic orientation axes is presented. A uniaxial tensile stress of 100 mega-Pascals is applied along the axes in order to obtain the piezoresistance values. Positive values indicate an increase in resistance for tensile stress. The change in resistance is inversely proportional to the change in mobility, which is directly proportional to the speed of the transistor. Thus, a higher piezoresistance value results in a slower transistor. Line 502 depicts piezoresistance values for the various crystallographic orientation axes. From FIG. 5, it can be seen that the piezoresistance varies from about 10 to about 50. As a result, an advantageous crystallographic orientation axis <110> is shown at 504 where the piezoresistance is just above 50. At the orientation axis <110>, where the piezoresistance value is at a maximum, the PMOS device is more sensitive to strain, and as a result, compressive strain (opposite the tensile strain applied to obtain the line 502) applied along the <110> orientation provides an increased benefit in hole and channel mobility for PMOS devices.

Figure 6:
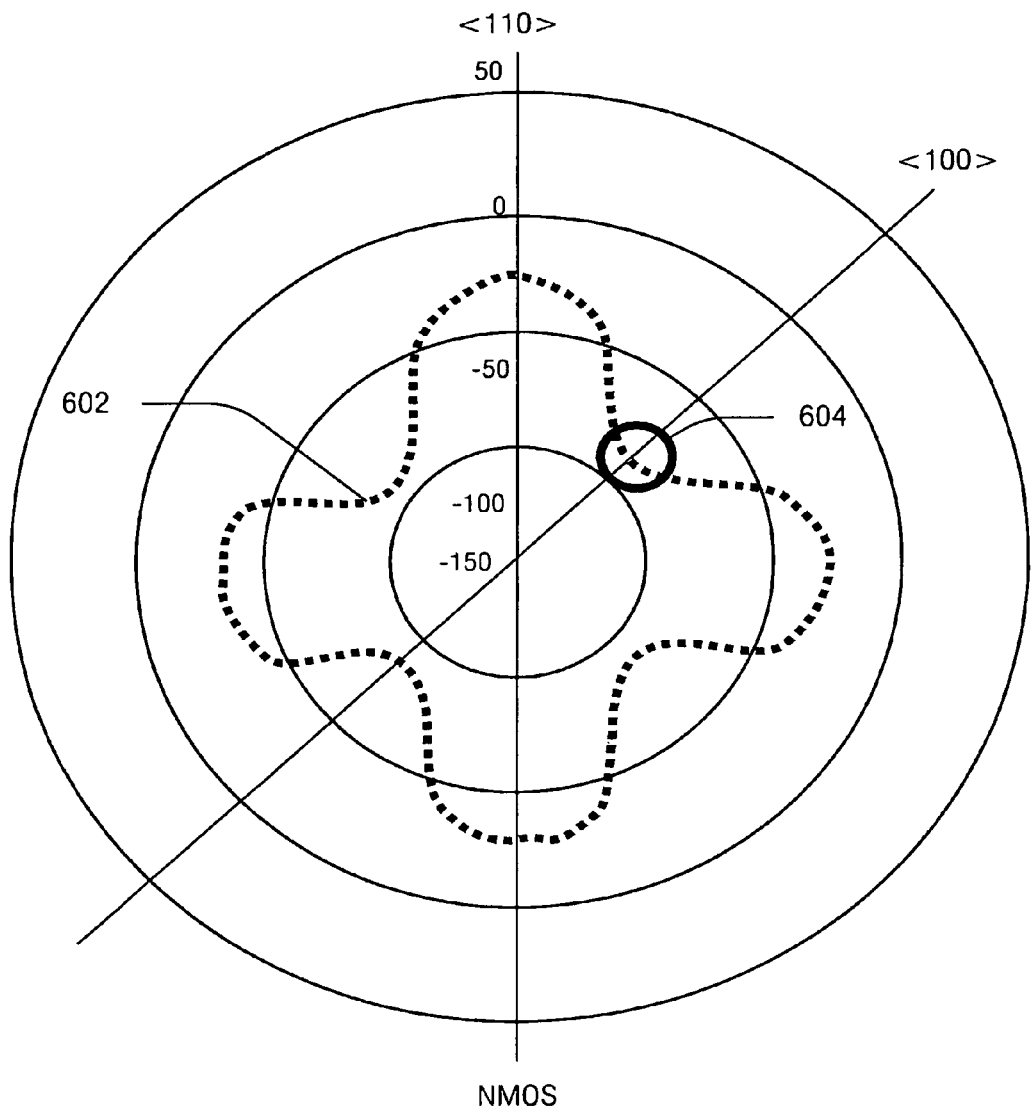
FIG. 6 is a graph illustrating exemplary piezoresistance values for a NMOS transistor device oriented along various crystallographic orientation axes.

FIG. 6 is a graph illustrating exemplary piezoresistance for an NMOS transistor device oriented along various crystallographic orientation axes. A uniaxial tensile stress of 100 mega-Pascals is applied longitudinally along the axes in order to obtain the piezoresistance values. Line 602 depicts piezoresistance values for the various crystallographic orientation axes with the tensile strain. From FIG. 6, it can be seen that the piezoresistance varies from about −90 to about −25.

As stated above, as piezoresistance decreases, channel electron mobility increases. Therefore, an advantageous crystallographic orientation axis <100> is shown at 604 where the piezoresistance is just above −100 and at about −90. At this minimum value of piezoresistance (−90), the NMOS device is relatively most sensitive to strain. As a result, application of tensile strain for a channel along the <100> orientation axis would improve electron mobility for an NMOS device more so than other orientations.

Figure 7:
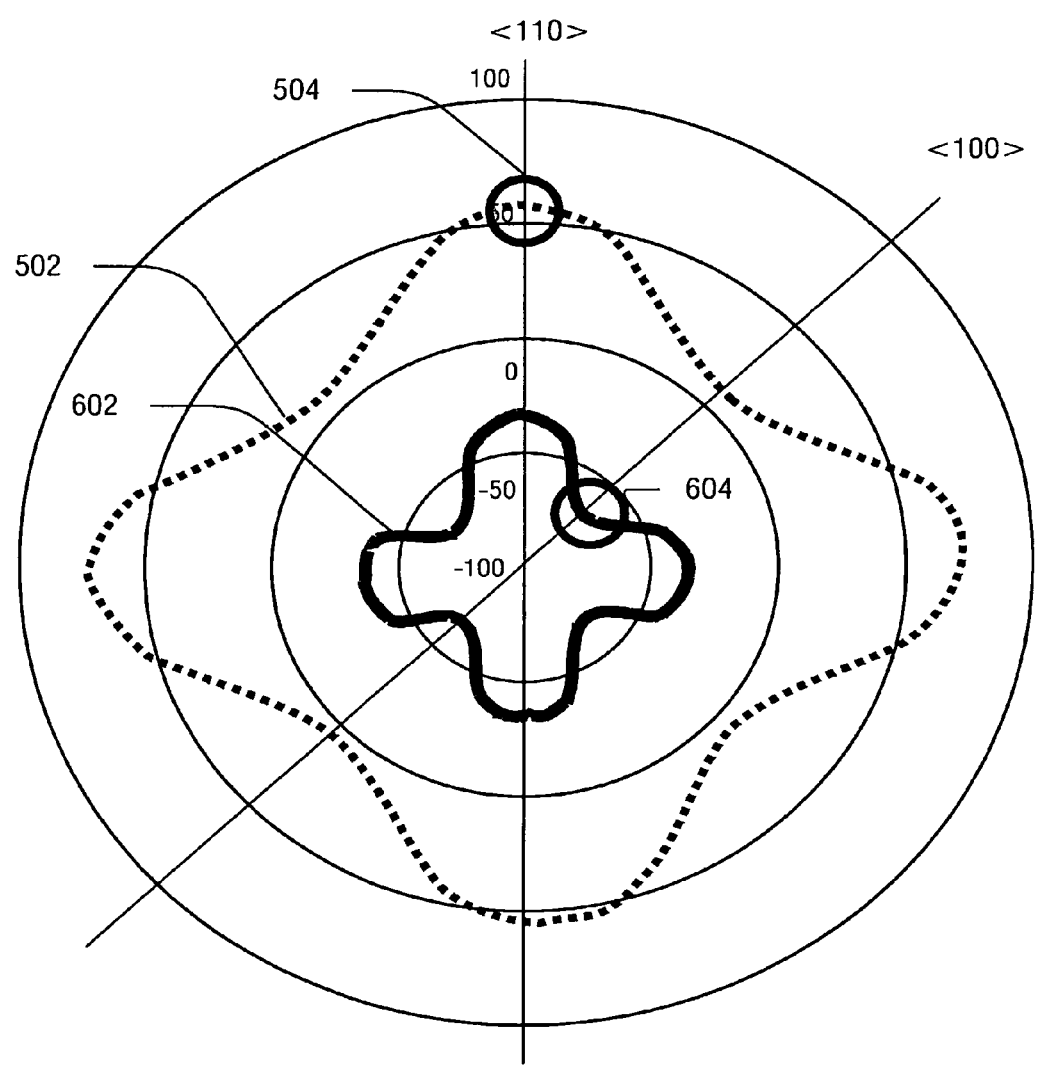
FIG. 7 is a graph illustrating exemplary piezoresistance values for NMOS and PMOS devices oriented along various crystallographic orientation axes.

FIG. 7 is a graph also illustrating exemplary piezoresistance values for both NMOS and PMOS devices. A uniaxial tensile stress of 100 mega-Pascals is applied along the axes in order to obtain the piezoresistance values. Line 502 depicts piezoresistance values for a PMOS device and line 602 depicts piezoresistance values for an NMOS device. A desirable piezoresistance value for the PMOS device is shown at 504 and a desirable piezoresistance value for the NMOS device is shown at 604. Compressive strain along the <110> orientation improves hole mobility whereas tensile strain for a channel along the <100> orientation improves electron mobility. However, in a conventional semiconductor or integrated circuit (IC) design layout, both devices (NMOS and PMOS) are typically formed along the same crystallographic orientation axis. As a result, conventional devices are often unable to obtain an improved channel mobility with applied strain for both NMOS and PMOS devices as the present invention obtains.

Figure 8:
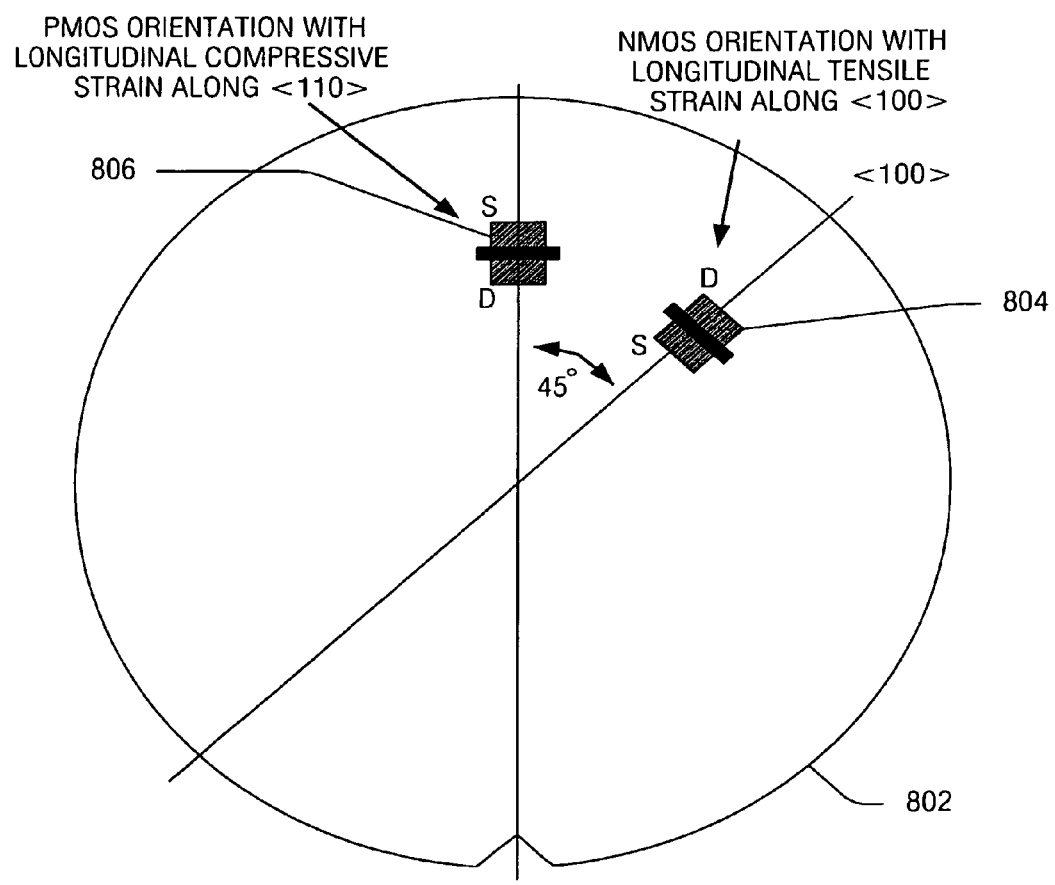
FIG. 8 is diagram illustrating a top view of a memory device and layout that facilitates channel mobility for both PMOS and NMOS devices in accordance with an aspect of the present invention.

Turning now to FIG. 8, a top view of a layout illustrating a semiconductor wafer containing a transistor (not to scale) in accordance with an aspect of the present invention is presented. The view depicts a layout of PMOS and NMOS devices with each having different crystallographic orientation axes in order to facilitate optimum or improved simultaneous improvement of NMOS and PMOS transistor devices by applying differing types of stress to each type of device along differing crystallographic orientations.

A wafer 802 is shown having a typical <110> crystallographic orientation axis, but can have a different orientation and still be in accordance with the present invention. The wafer 802 is typically comprised of silicon or another suitable semiconductor material. NMOS devices 802 are formed oriented along a <100> crystallographic orientation axis and are formed such that their channel regions are applied with longitudinal tensile strain along that axis during fabrication, thereby improving electron mobility and performance of the NMOS devices 802. Because of the improved performance, the NMOS devices 802 can be fabricated with smaller dimensions. The strain applied can be uniaxial or biaxial.

Similarly, PMOS devices 804 are formed along a <110> crystallographic orientation axis and are formed such that their channel regions are applied with longitudinal compressive strain along that axis during fabrication. As a result, hole mobility and, correspondingly, performance of the PMOS devices 804 is improved. Additionally, the improved performance also permits greater scaling to be achieved. The compressive strain can be applied to the channel region in a uniaxial or biaxial manner.

The NMOS devices 804 achieve their <100> crystallographic orientation axis by laying out the NMOS devices 804 at a non-parallel offset angle from the axis employed by the PMOS devices. In this instance, the offset angle is 45 degrees. This permits the NMOS devices 804 and the PMOS devices 806 to be fabricated within the same semiconductor substrate of the wafer 802, unlike other mechanisms or solutions that require etching away some of the substrate and depositing other substrate material to fabricate devices within. Thus, the PMOS devices 806 and the NMOS devices 804 are formed within semiconductor material having the same crystallographic orientation axis, but because the NMOS devices 804 are offset from the PMOS devices 806 by a suitable amount (e.g., 45 degrees), the NMOS devices are formed along a different crystallographic orientation axis.

It is appreciated that generally, layout tools and devices are used for layouts that have 90 degree variations instead of 45 degrees. As a result, additional area may be consumed by employing the layout of FIG. 8. However, tools can be developed and designed for such 45 degree layouts that can mitigate area consumption and, in some instances, can improve area consumption of devices and structures. Furthermore, such a layout can also facilitate routing of interconnects and the like by permitting 45 degree paths and connections instead of being limited to only 90 degrees.

The methodologies described below can be better appreciated and understood in conjunction with FIGS. 1-8 described above. While, for purposes of simplicity of explanation, the methodologies described infra are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 9:
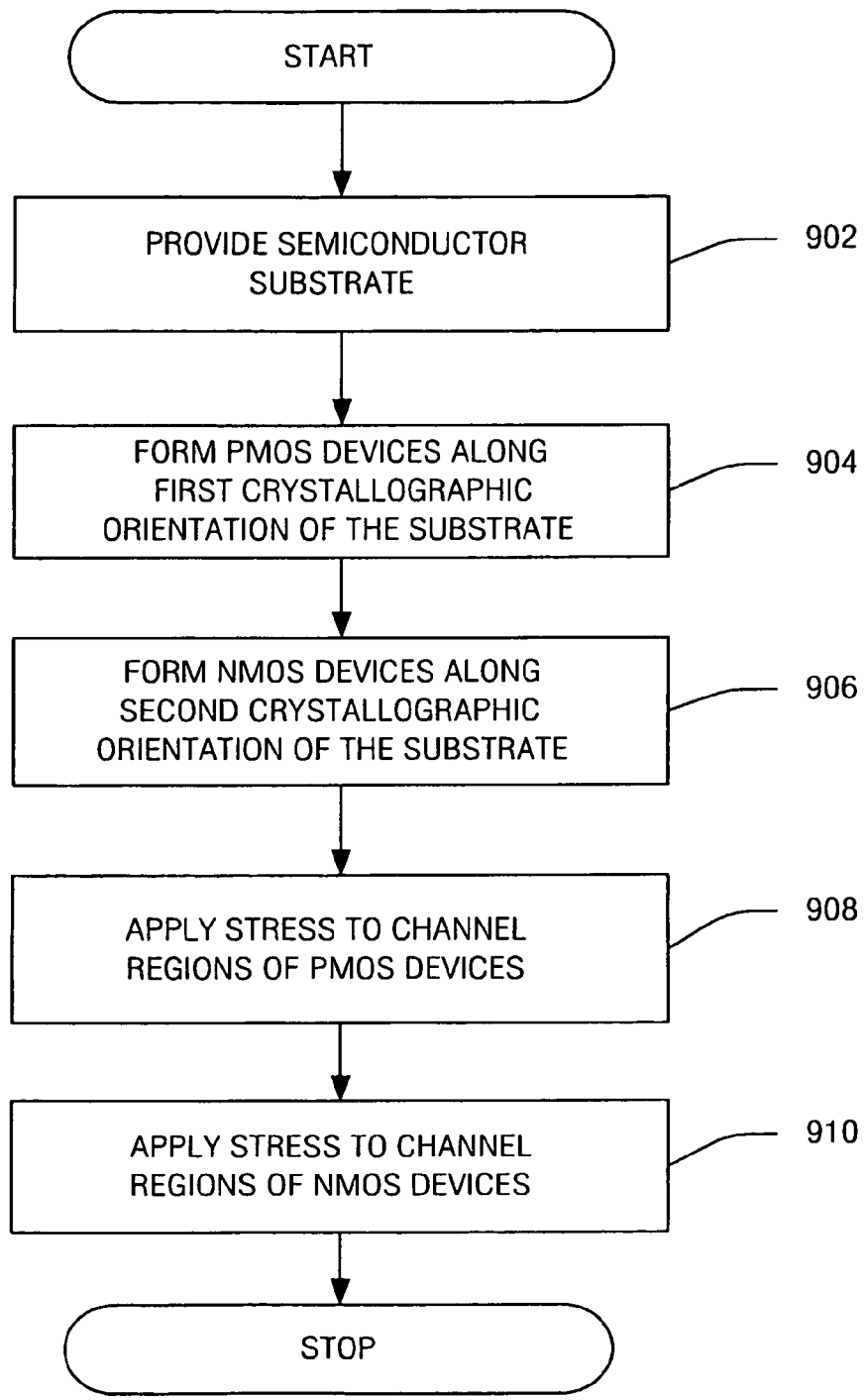
FIG. 9 is a flow diagram illustrating a method of fabricating a semiconductor device in accordance with an aspect of the present invention.

FIG. 9 is a flow diagram of a method of fabricating a semiconductor device in accordance with an aspect of the present invention. The method fabricates the device with NMOS and PMOS devices being fabricated along differing crystallographic orientation axes and improved channel mobility, which is obtained by selectively applying strain to channel regions for each type of device separately.

The method begins at 902 wherein a semiconductor substrate is provided. The semiconductor substrate is comprised of a semiconductor material such as silicon. PMOS devices are fabricated on the semiconductor substrate with source to drain channel regions along a suitable first crystallographic orientation axis of the substrate at block 904. The suitable crystallographic orientation axis can be selected by using a graph such as that of FIG. 5 to select a desirable orientation. For example, FIG. 5 shows that for silicon, a <100> orientation axis is desirable for PMOS devices. The PMOS devices can be fabricated by implanting an n-type dopant forming n-type well regions. Then, active regions (source/drain) can be formed within the well regions by selectively implanting a p-type dopant. The channel regions are along the <100> orientation axis from source to drain (active regions). Gate structures (e.g., metal and/or polysilicon) are then formed over the respective channel regions. A relatively thin insulator layer (e.g., oxide) is typically formed between the gate structures and the channel regions. Other components and/or structures can also be fabricated, but are omitted to simplify this description.

NMOS devices are also fabricated on the semiconductor substrate but offset by a suitable angle to have source to drain channel regions along a different, second suitable crystallographic orientation axis of the substrate at block 906. FIG. 6, described above, can be employed to select a suitable orientation for the NMOS devices. FIG. 6 illustrates that, for an NMOS device and a silicon substrate, a <110> crystallographic orientation axis is preferable. A suitable value for the offset angle to attain this crystallographic orientation axis is 45 degrees, 135 degrees, 225 degrees, and 315 degrees, clockwise. It is appreciated that other types of semiconductor substrate materials, such as silicon-germanium, have different piezoresistive properties that can result in different crystallographic orientation axes and/or offset values being chosen. Generally, graphs similar to those of FIGS. 5 and 6 but for different semiconductor materials can be employed to facilitate selection. The NMOS devices can be fabricated by implanting a p-type dopant thereby forming p-type well regions. Then, active regions (source/drain) can be formed within the well regions by selectively implanting a p-type dopant. The channel regions are along the <110> orientation from source to drain (active regions). Gate structures (e.g., metal and/or polysilicon) are then formed over the respective channel regions. A relatively thin insulator layer (e.g., oxide) is typically formed between the gate structures and the channel regions.

Strain/stress is then applied to the PMOS devices longitudinally across the channel regions to improve hole mobility at block 908. Generally, a compressive uniaxial longitudinal or biaxial strain is applied to improve hole mobility. FIGS. 1 and 2, described above describe and illustrate how compressive strain can improve hole mobility. The strain can be introduced to the channel region by a suitable mechanism. One such mechanism is to perform a recess etch around or surrounding the channel regions and deposit a relatively thick silicon-germanium epitaxial layer, which introduces compressive stress on the channel regions of the PMOS devices. Other suitable mechanisms can be employed to introduce compressive stress longitudinally across the channel regions.

Similarly, strain is also applied to the NMOS devices across the channel regions to improve electron mobility at block 910. A uniaxial or biaxial tensile strain is typically employed to improve the electron mobility. FIGS. 3 and 4, described above, illustrate and describe how tensile strain can improve electron mobility. A suitable mechanism that can be employed is to perform a recess etch around or surrounding the channel regions and deposit a carbon doped silicon layer that introduces a tensile stress on the channel regions. Another suitable mechanism is to deposit an inter layer dielectric material that creates a tensile stress on the channel regions. Other suitable mechanisms can also be employed to introduce the tensile stress longitudinally across the channel regions. It is appreciated that introduction of strain on the NMOS devices at block 910 can be performed before or after the introduction of strain on the PMOS devices at block 908. Furthermore, it is also noted that the strain introduced at block 908 and 910 can be introduced during or before performance of fabrication blocks 904 and 906.

Figure 10:
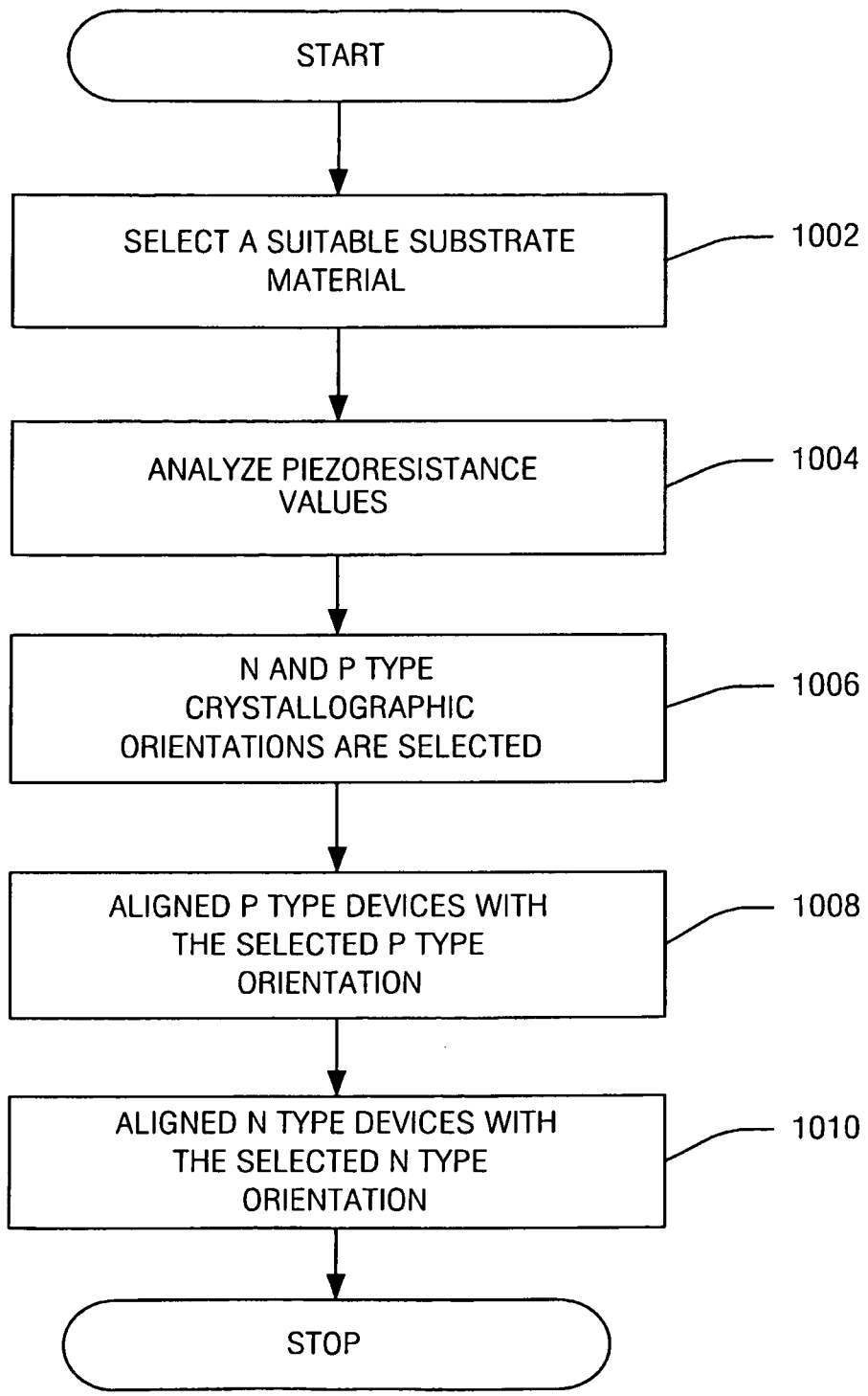
FIG. 10 is a flow diagram illustrating a method of generating a layout of a semiconductor device that facilitates channel mobility in accordance with an aspect of the present invention.

FIG. 10 is a flow diagram illustrating a method of generating a layout of a semiconductor device that facilitates channel mobility in accordance with an aspect of the present invention. The fabricated device is to have N type and P type transistor devices. The transistor devices can be any suitable transistor device such as, but not limited to, MOS and/or FET devices.

The method begins at block 1002 wherein a suitable semiconductor substrate is selected. Some suitable materials for the substrate include, but are not limited to, silicon, germanium, silicon-germanium, and the like. Piezoresistance values are analyzed for N type and P type transistor devices for the selected substrate to obtain piezoresistive coefficients for N and P type transistor devices at block 1004. For P type transistor devices, the selected coefficient is generally a maximum value because for P type transistor devices, the larger the piezoresistance, the greater the hole mobility. In contrasts, for N type transistor devices, the selected coefficient is generally a minimum value because, for N type transistors, the lower the piezoresistance, the greater the electron mobility. Based on the obtained coefficients, crystallographic orientation axes are selected for the N and P type transistor devices at block 1006. It is appreciated that the selected orientations may or may not correspond to actual maximum and/or minimum piezoresistance values. As an example, <110> and <100> orientations are typically selected for NMOS and PMOS devices, respectively, formed in a silicon substrate.

The P type transistor devices are aligned such that their channel regions (from source to drain) are aligned with the selected P type crystallographic orientation axis at block 1008. Continuing with the above example of NMOS and PMOS devices formed on a silicon substrate, the PMOS devices would be oriented or aligned with the <110> crystallographic orientation axis. Subsequently, an offset angle is determined according to the selected n-type and p-type crystallographic orientation axes at block 1010. The offset angle is selected to align the N type transistor devices with the selected N type crystallographic orientation axis. With the above example of NMOS and PMOS devices formed on a silicon substrate, the NMOS devices would be oriented or aligned with the <100> crystallographic orientation axis thereby requiring a 45 degree offset.

Other aspects are also incorporated into the layout including component size, scaling, interconnects, and the like. Once completed, masks can be generated and fabrication performed to fabricate a semiconductor device with improved channel mobility.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A semiconductor device comprising:
a semiconductor substrate having a first crystallographic orientation axis and a distinct second crystallographic orientation axis;
a first type of transistor formed in the semiconductor substrate having a channel region aligned in a direction from source to drain along the first crystallographic orientation axis; and
a second type of transistor formed in the semiconductor substrate having a channel region aligned in a direction from source to drain along the second crystallographic orientation axis and rotated in a source to drain direction from the channel region of the first type of transistor by an offset angle, wherein the first type of transistor is p-type and the second type of transistor is n-type and wherein the first crystallographic orientation axis is <110> and the second crystallographic orientation axis is <100>.

2. The device of claim 1, wherein the channel region of the first type of transistor has improved channel mobility from applied strain along the first crystallographic orientation axis and wherein the channel region of the second type of transistor has improved channel mobility from applied strain along the second crystallographic orientation axis.

3. The device of claim 1, wherein the first type of transistor is n-type and the second type of transistor is p-type.

4. The device of claim 1, wherein the offset angle is 45 degrees.

5. The device of claim 1, wherein an epitaxial layer of silicon-germanium is formed on the channel region of the first type of transistor to apply a compressive strain to the channel region along the <110> crystallographic orientation axis.

6. The device of claim 5, wherein a layer of carbon doped silicon is formed on the channel region of the second type of transistor to apply a tensile strain to the channel region along the <100> crystallographic orientation axis.

7. A semiconductor device comprising:
- a semiconductor substrate having a first and second distinct crystallographic orientation axes;
- a first type of lateral transistor formed in the semiconductor substrate having a channel region aligned in a direction from source to drain along the first crystallographic orientation axis; and
- a second type of lateral transistor formed in the semiconductor substrate having a channel region aligned in a direction from source to drain along the second crystallographic orientation axis and offset from the first type of transistor by an offset angle, wherein:
  - the channel region of the first type of lateral transistor has improved channel mobility from applied strain along the first crystallographic orientation axis and wherein the channel region of the second type of lateral transistor has improved channel mobility from applied strain along the second crystallographic orientation axis;
  - the first type of lateral transistor is p-type and the second type of lateral transistor is n-type; and
  - the first crystallographic orientation axis is <110> and the second crystallographic orientation axis is <100>.

8. The device of claim 7, wherein the first type of lateral transistor is n-type and the second type of lateral transistor is p-type.

9. The device of claim 7, wherein the offset angle is 45 degrees.

10. The device of claim 7, wherein an epitaxial layer of silicon-germanium is formed on the channel region of the first type of lateral transistor to apply a compressive strain to the channel region along the <110> crystallographic orientation axis.

11. The device of claim 10, wherein a layer of carbon doped silicon is formed on the channel region of the second type of lateral transistor to apply a tensile strain to the channel region along the <100> crystallographic orientation axis.

* * * * *